US009093604B2

(12) United States Patent
Stauβ et al.

(10) Patent No.: US 9,093,604 B2
(45) Date of Patent: Jul. 28, 2015

(54) METHOD OF PRODUCING AN OPTOELECTRONIC SEMICONDUCTOR CHIP, AND SUCH A SEMICONDUCTOR CHIP

(75) Inventors: Peter Stauβ, Regensburg (DE); Alexander Behres, Pfatter (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/883,782

(22) PCT Filed: Oct. 21, 2011

(86) PCT No.: PCT/EP2011/068476
§ 371 (c)(1),
(2), (4) Date: Jul. 1, 2013

(87) PCT Pub. No.: WO2012/069262
PCT Pub. Date: May 31, 2012

(65) Prior Publication Data
US 2013/0328101 A1 Dec. 12, 2013

(30) Foreign Application Priority Data

Nov. 26, 2010 (DE) .......................... 10 2010 052 727

(51) Int. Cl.
*H01L 33/26* (2010.01)
*H01L 21/02* (2006.01)
(Continued)

(52) U.S. Cl.
CPC .......... *H01L 33/26* (2013.01); *H01L 21/02381* (2013.01); *H01L 21/02461* (2013.01); *H01L 21/02463* (2013.01); *H01L 21/02505* (2013.01);
(Continued)

(58) Field of Classification Search
CPC ...... H01L 33/26; H01L 33/0066; H01L 33/12; H01L 33/0079; H01L 21/02381; H01L 21/02505; H01L 21/02543; H01L 21/02461; H01L 2924/0002; H01L 2933/0091
USPC ................. 257/101, 103, E33.023, E33.026, 257/E33.031; 438/46, 37, 45
See application file for complete search history.

(56) References Cited

U.S. PATENT DOCUMENTS

| 5,981,976 A | 11/1999 | Murasato | |
|---|---|---|---|
| 2002/0060317 A1* | 5/2002 | Ramdani et al. | ............... 257/19 |

(Continued)

FOREIGN PATENT DOCUMENTS

| DE | 197 54 042 A1 | 6/1998 |
|---|---|---|
| DE | 197 55 009 C1 | 8/1999 |

(Continued)

OTHER PUBLICATIONS

The Japanese Examination Report dated Apr. 22, 2014 for corresponding Japanese Application No. 2013-540282.

(Continued)

*Primary Examiner* — Zandra Smith
*Assistant Examiner* — Lauren R Bell
(74) *Attorney, Agent, or Firm* — DLA Piper LLP (US)

(57) ABSTRACT

A method of producing an optoelectronic semiconductor chip having a semiconductor layer stack based on a material system AlInGaP includes preparing a growth substrate having a silicon surface, arranging a compressively relaxed buffer layer stack on the growth substrate, and metamorphically, epitaxially growing the semiconductor layer stack on the buffer layer stack, the semiconductor layer stack having an active layer that generates radiation.

8 Claims, 1 Drawing Sheet

(51) Int. Cl.
*H01L 33/00* (2010.01)
*H01L 33/12* (2010.01)
*H01S 5/32* (2006.01)

(52) U.S. Cl.
CPC ...... *H01L 21/02543* (2013.01); *H01L 33/0066* (2013.01); *H01L 33/0079* (2013.01); *H01L 33/12* (2013.01); *H01L 2924/0002* (2013.01); *H01L 2933/0091* (2013.01); *H01S 5/3201* (2013.01); *H01S 2301/173* (2013.01)

(56) References Cited

U.S. PATENT DOCUMENTS

| | | | |
|---|---|---|---|
| 2005/0062049 A1 | 3/2005 | Lin et al. | |
| 2007/0131961 A1* | 6/2007 | Krames et al. | 257/103 |
| 2007/0181905 A1 | 8/2007 | Wang et al. | |
| 2008/0149915 A1* | 6/2008 | Mori et al. | 257/13 |
| 2008/0259980 A1 | 10/2008 | Wierer et al. | |
| 2008/0283819 A1 | 11/2008 | Konno | |
| 2009/0253249 A1* | 10/2009 | Taniguchi et al. | 438/478 |
| 2010/0200864 A1* | 8/2010 | Bader et al. | 257/76 |
| 2010/0263707 A1* | 10/2010 | Cheong et al. | 136/244 |
| 2010/0295015 A1 | 11/2010 | Kang et al. | |

FOREIGN PATENT DOCUMENTS

| | | |
|---|---|---|
| JP | 58-66353 | 4/1983 |
| JP | 62-1293 | 1/1987 |
| JP | 62-58690 | 3/1987 |
| JP | 3-71679 | 3/1991 |
| JP | 4-257276 | 9/1992 |
| JP | 7-79017 | 3/1995 |
| JP | 2005-268647 | 9/2005 |
| JP | 2007-96157 | 4/2007 |
| JP | 2009-231560 | 10/2009 |
| JP | 2010-186829 | 8/2010 |
| WO | 00/34989 A1 | 6/2000 |

OTHER PUBLICATIONS

English translation of Chinese Search Report of corresponding Chinese Application No. 201180056609.5 dated Mar. 26, 2015.

English translation of Japanese Decision of Rejection dispatched Mar. 24, 2015 from corresponding Japanese Application No. 2013-540282.

* cited by examiner

METHOD OF PRODUCING AN OPTOELECTRONIC SEMICONDUCTOR CHIP, AND SUCH A SEMICONDUCTOR CHIP

TECHNICAL FIELD

This disclosure relates to a method of producing an optoelectronic semiconductor chip having a semiconductor layer stack, and to a semiconductor chip produced by such a method.

BACKGROUND

Compound semiconductor materials are of great importance for the production of, for example, light-emitting diodes (LEDs). For the production of such LEDs, suitable layer sequences are grown onto a growth substrate. The growth substrate used is, for example, a GaAs substrate. If, however, an AlInGaP semiconductor layer sequence is grown pseudomorphically onto such a GaAs growth substrate, the LEDs so produced, as a result of the band profile at short wavelengths in the range of about 530 to 590 nm, have a potential well of only shallow depth, with the result that disadvantageously high internal efficiency losses can occur as a result of a charge carrier excess.

The growth substrates used for metamorphic AlInGaP semiconductor layer sequences are, for example, GaAs or GaP growth substrates. However, as a result of tensile strains between, for example, a GaAs growth substrate and a semiconductor layer sequence, the active layer of the semiconductor layer sequence cannot be produced with sufficiently good crystal quality. To achieve significantly higher crystal quality it is possible to use, for example, GaP substrates, but a disadvantage is that such substrates are obtainable only in small wafer sizes and at high prices.

A problem is to define a method of producing a semiconductor chip that can be implemented in an economical way, while at the same time a semiconductor layer stack having high crystal quality is produced. A further problem is to define a semiconductor chip that exhibits layers grown with high quality and that can be produced economically and in a wafer composite.

SUMMARY

We provide a method of producing an optoelectronic semiconductor chip having a semiconductor layer stack based on a material system AlInGaP, including preparing a growth substrate having a silicon surface, arranging a compressively relaxed buffer layer stack on the growth substrate, and metamorphically, epitaxially growing the semiconductor layer stack on the buffer layer stack, the semiconductor layer stack having an active layer that generates radiation.

We also provide a semiconductor chip, produced in accordance with the method of producing an optoelectronic semiconductor chip having a semiconductor layer stack based on a material system AlInGaP, including preparing a growth substrate having a silicon surface, arranging a compressively relaxed buffer layer stack on the growth substrate, metamorphically, epitaxially growing the semiconductor layer stack on the buffer layer stack, the semiconductor layer stack having an active layer that generates radiation, and having a carrier substrate and a semiconductor layer stack based on the material system AlInGaP.

We further provide a method of producing an optoelectronic semiconductor chip having a semiconductor layer stack based on a material system AlInGaP, including preparing a growth substrate having a silicon surface, applying a nucleation layer to the silicon surface, wherein the nucleation layer is a GaP layer, an AlGaP layer or an AlP layer, applying an intermediate layer to the nucleation layer, the intermediate layer being pseudomorphic with respect to silicon and based on GaAlInPAs, arranging a compressively relaxed buffer layer stack of GaAlInPAs on the intermediate layer, the lattice constant of the buffer layer stack is arranged to increase gradually in the direction towards the semiconductor layer stack, and metamorphically, epitaxially growing the semiconductor layer stack on the buffer layer stack, the semiconductor layer stack having an active layer that generates radiation.

DETAILED DESCRIPTION

Figure 1:
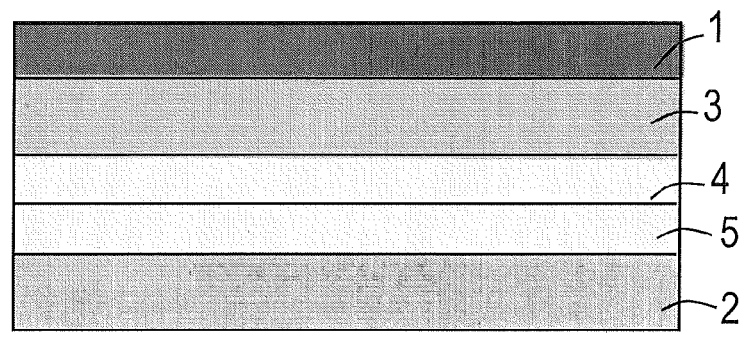
FIG. 1 is a diagrammatic cross-section through a semiconductor chip in our production method.

Our method of producing an optoelectronic semiconductor chip having a semiconductor layer stack based on the material system AlInGaP comprises the following method steps:

preparation of a growth substrate having a silicon surface,
arrangement of a compressively relaxed buffer layer stack on the growth substrate, and
metamorphic, epitaxial growth of the semiconductor layer stack on the buffer layer stack, the semiconductor layer stack having an active layer that generates radiation.

An optoelectronic semiconductor chip is especially a semiconductor chip that enables electronically generated data or energies to be converted into light emission or vice versa. For example, the optoelectronic semiconductor chip is a radiation-emitting semiconductor chip, for example, a LED or a laser diode.

The growth substrate comprises silicon. For example, the growth substrate has a silicon surface facing the semiconductor layer stack. Alternatively, the growth substrate can also be in the form of a silicon bulk substrate or in the form of a SOI substrate ("silicon on insulator substrate"). The growth substrate can contain further materials or material components in addition to silicon.

The use of silicon as a growth substrate enables AlInGaP semiconductor layers of high crystal quality to be produced. At the same time, silicon is an economical growth substrate material which, in particular, is also available in large diameters of more than 4 inches, enabling a plurality of semiconductor layer stacks to be grown in a wafer process for mass production. It is thus advantageously possible to produce in a wafer composite a plurality of semiconductor chips having AlInGaP semiconductor layers grown with high quality, the semiconductor layers advantageously being grown on an economical silicon growth substrate obtainable in large wafer diameters of up to 300 mm.

With the buffer layer stack arranged between the growth substrate and the semiconductor layer stack it is advantageously possible to produce metamorphic AlInGaP semiconductor layers. Metamorphic semiconductor layers are distinguished especially by lattice-matched growth of the layer sequence on the relaxed buffer layer stack by virtue of matched lattice constants of the materials. Semiconductor layers grown in that way accordingly exhibit high crystal quality, with the result that it is possible to achieve improved radiation efficiency during operation of the semiconductor chip.

By virtue of the buffer layer stack it is possible to compensate for a difference in the lattice constants of the growth substrate material and the semiconductor layer stack material. For that purpose, virtually all dislocations resulting from the lattice mismatch are enclosed in the relaxed buffer layer stack so that no dislocations or strains occur in the semiconductor layer stack.

Pseudomorphic semiconductor layers are especially semiconductor layers that are grown on the growth substrate with a lattice mismatch. The lattice mismatch is a result, in particular, of differences in the lattice constants of the growth substrate material and the layer stack material and results in a strain in the layer. In particular, the lattice mismatch does not result in dislocations.

The semiconductor layer stack is based on the material system AlInGaP. That means that the semiconductor layer sequence is a layer sequence deposited epitaxially on the substrate and has at least one layer of the AlInGaP compound material, that is to say $Al_nGa_mIn_{1-m-n}P$, wherein $0 \leq n$, $m \leq 1$, $n+m \leq 1$. That material need not necessarily have a mathematically exact composition in accordance with the above formula. Rather, it may comprise one or more dopants and also additional constituents which do not appreciably change the characteristic physical properties of the AlInGaP material. For the sake of simplicity, however, the above formula includes only the basic constituents of the crystal lattice (Al, Ga, In, P), although they can to some extent be replaced by small amounts of other substances.

The active layer of the semiconductor layer stack preferably comprises a pn-junction, a double heterostructure, a single quantum well structure (SQW, single quantum well) or a multiple quantum well structure (MQW, multi quantum well) to generate radiation. The term quantum well structure does not have any significance here in respect of the dimensionality of the quantization. It therefore encompasses inter alia quantum troughs, quantum wires and quantum dots and any combination of those structures.

Prior to arrangement of the buffer layer stack a pseudomorphic intermediate layer may be applied to the growth substrate and then the buffer layer stack may be applied to the intermediate layer. The intermediate layer, by virtue of its pseudomorphic property, exhibits a lattice mismatch with respect to the growth substrate, which mismatch does not relax to form dislocations, but manifests itself as strains. The lattice mismatch occurs in particular as a result of a lattice constant of the intermediate layer that is different from the lattice constant of the growth substrate. The intermediate layer is, for example, a buffer layer which comprises GaAlInPAs and is pseudomorphic with respect to silicon.

The intermediate layer is arranged between the growth substrate and the buffer layer stack. Utilization of such an intermediate layer allows the growth of the layers of the semiconductor layer stack on the silicon growth substrate with compressive pre-strain which prevents any occurrence of mechanical damage to the epitaxial layers. It is thus advantageously possible to produce a semiconductor layer stack on a silicon growth substrate having considerable thickness and high crystal quality. In addition, such an intermediate layer enables defects to be reduced so that crack-free growth of the semiconductor layers on the silicon growth substrate is made possible.

For growth on silicon growth substrates there are used inter alia special nucleation processes. These offer the possibility of growing the semiconductor layer stack onto a silicon growth substrate of large surface area. In particular, it is thus possible to achieve defect-reduced growth of the semiconductor layers, it being possible for strains between the layers to be avoided and even reduced.

Prior to application of the intermediate layer a nucleation layer may be applied to the growth substrate and then the intermediate layer may be applied to the nucleation layer. The nucleation layer may comprise, for example, AlGaP. The nucleation layer is especially arranged between the intermediate layer and the growth substrate.

The lattice constant of the buffer layer stack may be arranged to increase gradually in the direction of the semiconductor layer stack. If, for example, the semiconductor layer stack has layers having a larger lattice constant than the lattice constant of the growth substrate, the buffer layer stack is arranged to relax to form dislocations gradually towards the larger lattice constant. On the buffer layer stack, the AlInGaP semiconductor layer stack is then grown lattice-matched on the compressively relaxed buffer layer stack.

The buffer layer stack advantageously has on the side of the growth substrate a lattice constant matched to the lattice constant of the growth substrate and on the side of the semiconductor layer stack a lattice constant matched to the lattice constant of the semiconductor layer stack.

The lattice constant of the buffer layer stack may be increased by addition of indium and/or arsenic. In a direction from the growth substrate towards the semiconductor layer stack, that is to say in the direction of growth, the indium and/or arsenic content of the buffer layer stack is therefore increased. With a buffer layer stack so formed, the surface morphology of the buffer layer stack can advantageously be improved so that the layers of the semiconductor layer stack grown over the buffer layer stack can be deposited with improved crystalline quality and homogeneity, with the result that strains in the semiconductor chip are avoided, which is distinguished by increased radiation efficiency during operation of the semiconductor chip.

The buffer layer stack may be formed from a plurality of buffer layers, the lattice constants of which are arranged to increase from layer to layer in the direction of the semiconductor layer stack. The buffer layer stack is accordingly composed of a sequence of layers which each have a lattice constant such that the layer of the buffer layer stack facing the semiconductor layer stack has a lattice constant matched to the material of the semiconductor layer stack and the layer of the buffer layer stack that faces the growth substrate has a lattice constant matched to silicon. Strains that may arise as a result of different lattice constants during the growth process are thus reduced or avoided.

The method may comprise the following further method steps:
    application of a carrier substrate to the side of the semiconductor layer stack opposite from the growth substrate, and
    detachment of the growth substrate.

Accordingly, the silicon growth substrate is fully or at least partly detached after the epitaxial deposition of the layers of the semiconductor layer stack. It is thus possible to produce a semiconductor chip also known as a thin-film chip. A thin-film chip is considered to be especially a semiconductor chip during the production of which the growth substrate on which the semiconductor layer stack was grown epitaxially has been partly or completely detached.

The carrier substrate comprises, for example, silicon and is, for example, in the form of a silicon bulk substrate. Such a silicon carrier substrate is distinguished by an economical substrate material optimally thermally matched to the semiconductor layers and the growth substrate. When selecting the material of the carrier substrate it is advantageous for the material of the carrier substrate to have good thermal coupling and thermal conductivity.

A mirror layer may be arranged between the carrier substrate and the semiconductor layer stack. The mirror layer comprises, for example, a metal or a metal alloy. This layer reflects the radiation generated in the active layer in the direction of the radiation exit side so that the radiation efficiency can advantageously be increased during operation of the semiconductor chip.

The growth substrate, the nucleation layer and/or the intermediate layer may be detached such that the side of the semiconductor chip facing away from the carrier substrate has radiation outcoupling structures. As radiation outcoupling structures it is possible to use three-dimensional structures, that is to say structures of three-dimensional form. As radiation outcoupling structures it is also possible to use, for example, roughening of the surface of the semiconductor chip facing away from the carrier substrate. The radiation outcoupling structures can be formed, for example, during the process of detaching the growth substrate, it also being possible for the nucleation layer, the intermediate layer and/or the buffer layer stack to be at least partly detached during the detachment process. The radiation outcoupling structures are accordingly formed in the intermediate layer and, for example, also in the buffer layer stack.

With the radiation outcoupling structures it is possible for the radiation generated in the active layer to be improved and coupled out of the semiconductor chip with greater efficiency, because the angle of the radiation which is formed in the active layer and which strikes the surface of the semiconductor chip is modified as a result of the outcoupling structures so that the total reflection effect of the radiation at the surface is reduced.

A plurality of semiconductor chips may be produced in a common method. In particular, the plurality of semiconductor chips is grown on a common growth substrate comprising silicon. Since silicon as substrate material is available in large diameters of up to 12 inches, it is thus possible for a large number of semiconductor chips to be grown together on the substrate, with the result that the semiconductor chips advantageously can be mass-produced in one process.

A semiconductor chip produced by a method as described above has a carrier substrate and a semiconductor layer stack on the carrier substrate. The semiconductor layer stack is based on the material system AlInGaP. The carrier substrate preferably has good thermal conductivity. For example, the carrier substrate comprises silicon and is, for example, in the form of a silicon bulk substrate.

A semiconductor chip so produced is distinguished by an economical production method and by semiconductor layers of high crystal quality. In addition, it is possible for semiconductor chips so produced to be produced together in a common process, especially in a wafer composite.

A mirror layer may be arranged between the carrier substrate and the semiconductor layer stack. Such a mirror layer, as a result of the reflection of radiation at that layer, results in an increase in outcoupling the radiation so that the radiation efficiency during operation of the semiconductor chip can be increased.

On the side of the semiconductor layer stack facing away from the carrier substrate, there may be arranged a buffer layer stack comprising AlGaInAsP, the lattice constant of which on the side facing the semiconductor layer stack is matched to the lattice constant of the semiconductor layer stack. Internal strains in the semiconductor layer stack can thus be reduced or avoided, with the result that such a semiconductor chip has high crystal quality.

On the side of the buffer layer stack facing away from the semiconductor layer stack there may be arranged an intermediate layer comprising AlInGaAsP. The intermediate layer is, for example, an optional buffer layer which is pseudomorphic with respect to silicon.

The intermediate layer and/or the buffer layer stack may have structuring. Such structuring especially increases the outcoupling of the radiation and can be generated, for example, by the process of detaching the growth substrate.

The semiconductor chip is preferably a LED, a thin-film LED or a laser.

The features mentioned in connection with the optoelectronic semiconductor chip also apply to the production method and vice versa.

Further advantages and expedient developments of the production method and the semiconductor chip will be found in the examples described below in conjunction with FIGS. 1 to 3.

In the Figures, parts that are identical or have identical action may be denoted by identical reference numerals. The parts illustrated and the relative sizes of the parts to one another should in principle not be regarded as to scale. Rather, the thickness or size of individual parts, such as, for example, layers, structures, components and regions, may have been exaggerated in the drawings for the purpose of better clarity and/or better understanding.

FIG. 1 shows an example of a semiconductor chip in cross section during the production process. The semiconductor chip has a growth substrate 2 comprising silicon. Individual layers of the semiconductor chip have been grown on the silicon growth substrate 2.

To grow semiconductor layers onto the silicon growth substrate 2 there is used a special initial-growth or nucleation process. Such a process offers the possibility of growing semiconductor layers onto silicon substrates of large surface area.

The initial-growth or nucleation process for growth on silicon surfaces includes especially the growth of a nucleation layer 5 on the silicon growth substrate 2. The nucleation layer 5 contains, for example, AlP, GaP or AlGaP. Semiconductor layers can be grown onto the nucleation layer 5 with reduced defects. Since silicon is distinguished as being an economical substrate material, it is thus possible to produce an economical semiconductor chip.

Optionally, an intermediate layer 4 can be applied to the nucleation layer. The intermediate layer 4 is, for example, a buffer layer comprising AlInGaAsP. The intermediate layer 4 can have pseudomorphic properties with respect to silicon, "pseudomorphic" meaning here that the intermediate layer is lattice-mismatched to silicon, that is to say the lattice constant of the intermediate layer differs from the lattice constant of the growth substrate, but the strain thereby produced has not relaxed to form dislocations.

The intermediate layer 4 also serves for defect reduction. In particular, the intermediate layer 4 improves the morphology of the nucleation layer 5. As a result, the semiconductor layers to be applied can be deposited with improved crystalline quality and homogeneity.

A buffer layer stack 3 is applied to the intermediate layer 4. The buffer layer stack can be composed of a layer sequence. Preferably, the buffer layer stack comprises AlInGaAsP. The buffer layer stack 3 has compressively relaxed properties, whereby a high-quality buffer layer stack can be achieved. As a result of the compressively relaxing buffer layer stack, the semiconductor layers to be applied can be deposited with high crystal quality on that buffer layer stack. Strains in the semiconductor layer stack, which can result in mechanical damage to the layers of the semiconductor chip, can thus be avoided or reduced.

The lattice constant of the buffer layer stack gradually increases in the direction away from the growth substrate 2. This means that the side of the buffer layer stack facing away from the growth substrate 2 has a larger lattice constant than the side of the buffer layer stack 3 facing the growth substrate 2. The lattice constant of the buffer layer stack can thus be matched, on the side of the growth substrate, to the lattice constant of the growth substrate and at the same time, on the side of the semiconductor layer stack to be applied, to the lattice constant of that semiconductor layer stack, with the result that strains in the layers of the semiconductor chip during the growth process can advantageously be reduced or avoided, and so it is advantageously possible to achieve higher radiation efficiency of the semiconductor chip during operation.

An increase in the lattice constant of the buffer layer stack in the direction of the semiconductor layer stack to be applied can be realized, for example, by addition of indium and/or arsenic. In particular, the regions of the buffer layer stack on the side of the semiconductor layer stack to be applied have a higher indium and/or arsenic content than the regions of the buffer layer stack on the side of the growth substrate 2.

If the buffer layer stack 3 is formed from a plurality of buffer layers, the lattice constant of the buffer layers can be arranged to increase from layer to layer in the direction of the semiconductor layer stack to be arranged. In that case the lattice constant in the buffer layer stack exhibits a step-like increase from the growth substrate in the direction of the semiconductor layer stack to be applied.

The semiconductor layer stack 1 is then grown metamorphically and epitaxially onto the buffer layer stack 3. Metamorphic growth is to be understood especially as being a lattice-matched growth onto the relaxed buffer layer stack 3 so that all dislocations are enclosed in the relaxed buffer layer stack and during the growth process strains in the layers of the semiconductor layer stack scarcely occur or do not relax to form dislocations.

As a result of these reduced strains during the growth process it is possible to realize increased crystal quality, whereby increased radiation efficiency can advantageously be achieved.

The semiconductor layer stack 1 is based on the material system AlGaInP and has an active layer that generates radiation. For example, the semiconductor chip is a LED chip, a thin-film chip or a laser diode.

Our production method advantageously makes it possible to use silicon as substrate material for the production of metamorphic AlInGaP semiconductor chips using a compressively relaxed and therefore high-quality buffer layer stack. At the same time, silicon as a substrate material is advantageously very economical and also available in large diameters up to 300 mm. It is thus possible to produce a plurality of semiconductor chips in a common method on a common growth substrate of large surface area, whereby such semiconductor chips can be mass-produced.

Subsequent to the method step shown in FIG. 1, a carrier substrate can be applied on the side of the semiconductor layer stack 1 facing away from the growth substrate 2, the growth substrate then being partly or completely detached. It is thus possible to produce a thin-film chip.

The carrier substrate preferably likewise comprises silicon which is distinguished by its cost-effectiveness. The silicon carrier substrate used for the thin-film chip makes it possible to realize an economical semiconductor chip, the carrier substrate being optimally thermally matched to the semiconductor layers of the semiconductor chip and the growth substrate.

A finished semiconductor chip is explained in greater detail below in conjunction with FIG. 3.

Figure 2:
FIG. 2 is a flow diagram showing the individual production steps of our production method.
Figure 2:
Figure 2:
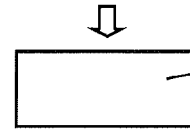
Figure 2:
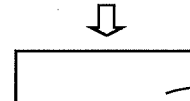
Figure 2:
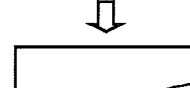

FIG. 2 shows a flow diagram for production of an optoelectronic semiconductor chip using our method.

In method step 201, a silicon growth substrate is prepared. On a growth side of the silicon growth substrate there is applied a nucleation layer which can optionally be used to grow semiconductor layers on the silicon surface. In particular, by virtue of the nucleation layer it is possible to grow defect-reduced semiconductor layers onto the silicon surface of the growth substrate. Silicon as growth substrate is especially preferred on account of the economical substrate material.

In method step 202, a pseudomorphic intermediate layer is then applied to the nucleation layer. The intermediate layer is, for example, a buffer layer of AlInGaAsP, which can also be used optionally for defect-reduced epitaxial growth of semiconductor layers onto the silicon growth substrate. The intermediate layer serves, for example, to improve the morphology of the nucleation layer, with the result that the semiconductor layers to be applied can be deposited with improved crystalline quality and homogeneity.

In method step 203, a compressively relaxed buffer layer stack is deposited on the intermediate layer. The buffer layer stack preferably exhibits a gradually increasing lattice constant in the direction of the growth substrate.

In method step 204, the semiconductor layer stack is then grown metamorphically and epitaxially on the buffer layer stack. In particular, the semiconductor layer stack is grown lattice-matched on the buffer layer stack, with the result that strains in the layers of the semiconductor layer stack are avoided or do not relax to form dislocations, which has a positive effect on the radiation efficiency of the semiconductor chip during operation.

In method step 205, a carrier substrate is then arranged on the side of the semiconductor layer stack facing away from the growth substrate. The carrier substrate preferably likewise comprises economical silicon. The carrier substrate can have a mirror layer on the side facing the semiconductor layer stack so that the mirror layer is arranged between the semiconductor layer stack and the carrier substrate.

In the same method step 205, after application of the carrier substrate the growth substrate is detached from the semiconductor layer stack. In particular, the growth substrate and the nucleation layer arranged thereon can be completely detached. In this method step, the intermediate layer can be at least partly detached. Preferably, the growth substrate, the nucleation layer and the intermediate layer are detached such that the side of the semiconductor chip facing away from the carrier substrate has radiation outcoupling structures. This advantageously improves the radiation outcoupling of the semiconductor chip during operation. The structuring can extend into the buffer layer stack, so that this too is at least partly detached.

Figure 3:
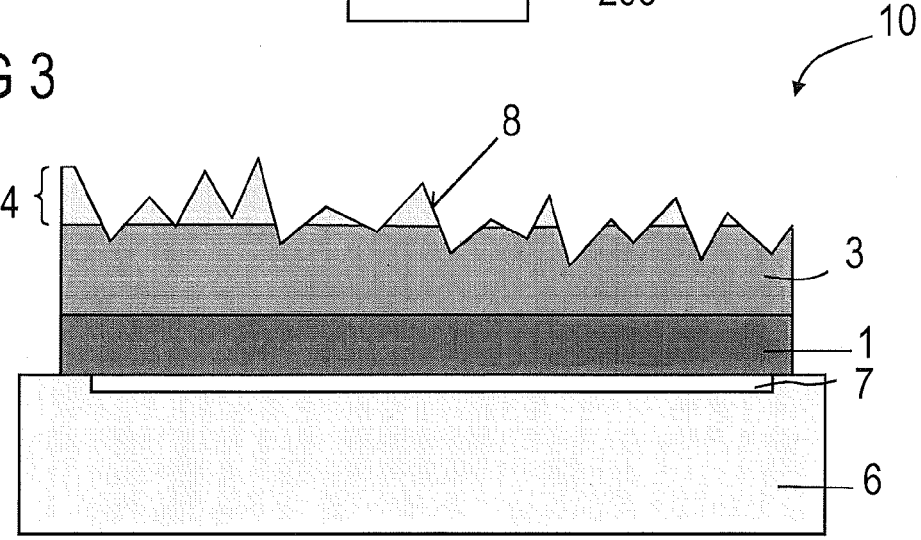
FIG. 3 is a diagrammatic cross-section through a semiconductor chip in accordance with an example.

FIG. 3 shows a semiconductor chip which has been produced, for example, by a method as explained in the examples of FIGS. 1 and 2.

The semiconductor chip has a carrier substrate 6 comprising silicon. A mirror layer 7 is arranged on the carrier substrate 6. On the mirror layer 7 there is arranged the semiconductor layer stack 1 which has an active layer that generates radiation. The mirror layer 7 is accordingly arranged between the carrier substrate 6 and the semiconductor layer stack 1.

The buffer layer stack 3 is arranged on the side of the semiconductor layer stack 1 facing away from the carrier substrate 6. The buffer layer stack 3, on the side facing away from the semiconductor layer stack 1, has irregularities or so-called "radiation outcoupling structures" 8 which have been formed by the process of detaching the growth substrate. By virtue of these radiation outcoupling structures 8, the radiation outcoupling efficiency of the semiconductor chip 10 during operation is advantageously improved.

The intermediate layer 4 is arranged on at least part of the buffer layer stack 3. The intermediate layer 4 is at least partly removed as a result of the process of detaching the growth substrate so that only remnants of the intermediate layer 4 remain arranged on the buffer layer stack 3. In particular, the intermediate layer 4 is structured. The structuring serves as radiation outcoupling structures 8 to improve the radiation efficiency of the semiconductor chip 10 during operation.

The layers of the semiconductor chip are based on the material system AlGaInP. In the example of FIG. 3, the semiconductor chip 10 is in the form of a thin-film LED. Alternatively, the semiconductor chip 10 can be in the form of a laser diode.

The description with reference to examples does not limit our chips and methods thereto, but rather this disclosure encompasses any novel feature and any combination of features, including in particular any combination of features in the appended claims, even if those features or combinations are not themselves explicitly defined in the claims or examples.

The invention claimed is:

1. A method of producing an optoelectronic semiconductor chip having a semiconductor layer stack based on a material system AlInGaP comprising:
   preparing a growth substrate having a silicon surface which is a surface of a silicon growth substrate,
   applying a nucleation layer directly to the silicon surface, wherein the nucleation layer is a GaP layer, an AlGaP layer or an AlP layer,
   applying an intermediate layer directly to the nucleation layer, said intermediate layer being pseudomorphic with respect to silicon and based on GaAlInPAs and comprising Ga, Al, In, P and As,
   arranging a compressively relaxed buffer layer stack of GaAlInPAs comprising Ga, Al, In, P and As directly on the intermediate layer such that the lattice constant of the buffer layer stack increases gradually in a direction towards the semiconductor layer stack so that virtually all dislocations resulting from a lattice mismatch between the intermediate layer and the semiconductor layer stack are enclosed in the relaxed buffer layer stack so that no dislocations or strains occur in the semiconductor layer stack, and
   metamorphically, epitaxially growing the semiconductor layer stack directly on the buffer layer stack, wherein the semiconductor layer stack has an active layer that generates radiation, and
   wherein the lattice constant of the buffer layer stack is increased by addition of arsenic.

2. The method according to claim 1, wherein the buffer layer stack is formed from a plurality of buffer layers.

3. The method according to claim 1, further comprising:
   applying a carrier substrate to a side of the semiconductor layer stack opposite from the growth substrate, and
   detaching the growth substrate.

4. The method according to claim 3, wherein a mirror layer is arranged between the carrier substrate and the semiconductor layer stack.

5. The method according to claim 3, further comprising detaching the nucleation layer or the intermediate layer and forming radiation outcoupling structures on a side of the semiconductor chip facing away from the carrier substrate.

6. The method of producing an optoelectronic semiconductor chip according to claim 1, wherein the semiconductor layer stack comprises a multi-quantum well structure.

7. The method of producing an optoelectronic semiconductor chip according to claim 1, wherein a carrier substrate is arranged on a side of the semiconductor layer stack remote from the buffer layer and the carrier substrate is a silicon substrate.

8. The method according to claim 1, wherein the optoelectronic semiconductor chip is a laser.

* * * * *